United States Patent [19]

Hiranami

[11] Patent Number: 5,191,214

[45] Date of Patent: Mar. 2, 1993

[54] METHOD OF MANUFACTURING DESIGN CARRIER

[76] Inventor: Kotaro Hiranami, 4-4-3 Nihonbashi Naniwa-ku, Ohsaka-shi, Ohsaka-fu, Japan

[21] Appl. No.: 621,892

[22] Filed: Dec. 4, 1990

[30] Foreign Application Priority Data

Oct. 17, 1990 [JP] Japan .................................. 2-276466

[51] Int. Cl.$^5$ .............................................. G03G 5/16
[52] U.S. Cl. .................................. 250/316.1; 40/434; 434/81
[58] Field of Search ...................... 250/316.1; 434/81; 40/434, 548

[56] References Cited

U.S. PATENT DOCUMENTS

| | | | |
|---|---|---|---|
| 2,393,968 | 2/1946 | Burchell et al. ...................... | 40/434 |
| 3,350,803 | 11/1967 | Stockwell .............................. | 40/434 |
| 3,838,431 | 9/1974 | Germer et al. .................... | 250/316.1 |

FOREIGN PATENT DOCUMENTS

| | | |
|---|---|---|
| 41-23188 | 6/1966 | Japan . |
| 44-6476 | 1/1969 | Japan . |
| 47-17111 | 10/1972 | Japan . |
| 49-107735 | 3/1974 | Japan . |
| 57-78516 | 7/1982 | Japan . |

Primary Examiner—Bruce C. Anderson
Attorney, Agent, or Firm—Fred Philpitt

[57] ABSTRACT

The present invention is summarized as a method of manufacturing a design carrier which is featured in that a desired pattern is drawn on a polarizing plate by heating and another polarizing plate is superposed thereon to constitute one design carrier.

11 Claims, 6 Drawing Sheets

METHOD OF MANUFACTURING DESIGN CARRIER

INDUSTRIAL FIELD OF UTILIZATION

The present invention relates to a method of manufacturing a design carrier which is used for various things such as a plate for a slide, an original copy for printing, a design pattern for textile printing, a design pattern for illumination, video software and others.

PRIOR ART AND PROBLEMS THEREOF

When a specified picture pattern is drawn, in general, it is usually drawn on drawing paper with coloring materials. In this regard, the use of a polarizing plate enables attainment of particular colors and patterns by the interference and refraction of polarized light, and therefore it is utilized for the plate for the slide, the original copy for printing and the design pattern for textile printing. According to this method, a material such as cellophane, vinyl or mica is interposed between two polarizing plates, angles of this interposed material and the polarizing plates to an optical axis are varied, a design (which is generally a combination of patterns and colors including achromatic colors and transparency, in the present Specification) thus obtained is photographed and a film of the photograph is employed as a design carrier for the textile printing or others, as disclosed in the Patent Gazette of Japanese Patent Publication No. 17111/1972, for instance.

However, such a technique as described above necessitates a specific apparatus for obtaining the design, that is, a specific apparatus comprising two polarizing plates which can change the optical axis, a stage for mounting an interposed material provided between said plates, a light source, a screen, a camera, etc. Besides, no specified design is obtained intentionally, but some design preferred by an operator of the apparatus is only selected or found by him out of designs which are varied by the way of setting the interposed material, angles of the polarizing plates, etc. In other words, the design obtained by this technique cannot be a creative work intended beforehand by a designer, but is only an accidental production. Let it be supposed, for instance, that the designer intends to make a specified design, using a linear pattern and a circle as basic patterns. Even when a transparent material having such a pattern is selected and interposed between the polarizing plates, it is impossible, according to the above-stated technique, to realize a fundamental motif of the design by the use of the pattern of the interposed material, because the transmitted light interferes variously and is refracted.

This is so with colors. Even if some specified colored pattern is intended, it is a task of extreme difficulty to choose a material enabling production of this pattern. The difficulty is much more with regard to gradation, namely, its color tone is changed gradually.

As described above, the prior art has a disadvantage that the design is almost ruled by accident and the intention of the designer is rarely reflected directly in the design.

In the above-described technique, in addition, an image on a screen is photographed and the design is represented as an aggregate of grains in a film for the photograph that is a design carrier. When the photograph is enlarged, therefore, graininess thereof appears and this causes another disadvantage that it can not be enlarged in excess of a certain extent from a commercial point of view.

OBJECT OF THE PRESENT INVENTION

In consideration of shortcomings of the prior art as stated above, the present invention is aimed to provide a method of manufacturing a design carrier which makes it possible for the designer to express exactly a design of patterns and colors in accordance with an image or a motif of himself on the premise of the effect of polarizing plates, and particularly to provide a method enabling easy expression of natural variation of colors, i.e. gradation. It is aimed, moreover, to provide the design carrier having very large margin for enlargement when it is enlarged in use, and being free from graininess.

SUMMARY OF THE INVENTION

The present invention is summarized as a manufacturing method of a design carrier which is featured in that a desired pattern is drawn on a polarizing plate by heating and another polarizing plate is superposed thereon to constitute one design carrier.

A fundamental member to which the present invention is applied is polarizing plates. A polarizing plate is manufactured generally by a method wherein a macromolecular film of polyvinyl alcohol or the like is heated, stretched several times, dipped in an aqueous solution of iodine or potassium iodide or a metal solution so as to be dyed, and dried, and a film or a thin layer thus prepared is sandwiched between acrylic resin plates or cellulose acetate resin plates. The polarizing plate thus manufactured has different extinction coefficients in the direction of stretching of the aforesaid film or thin layer and in the direction perpendicular thereto, and only a light oscillating in a specified direction passes through the plate.

DETAILED DESCRIPTION OF THE INVENTION

Figure 1:
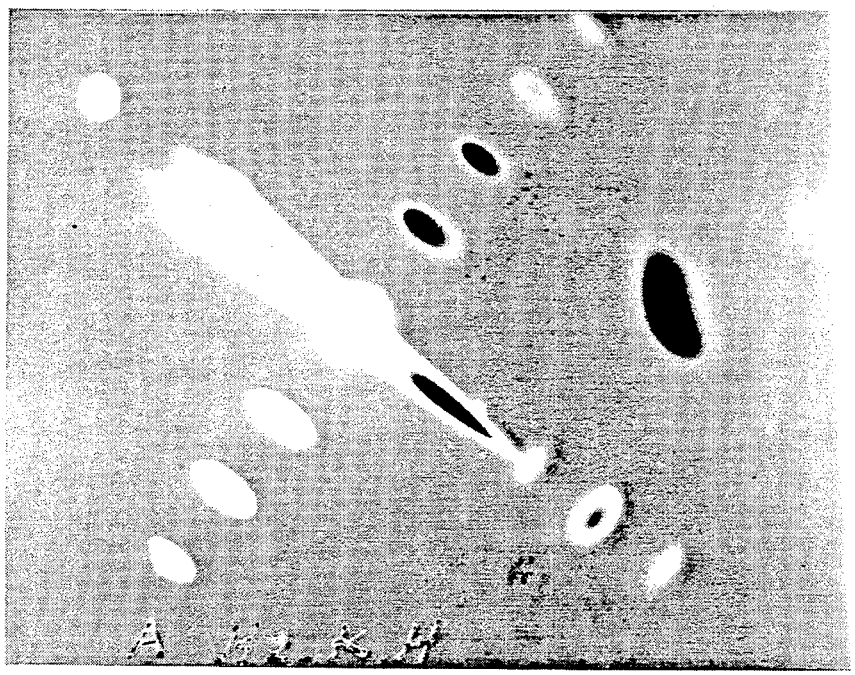

Making a heat pen approach a polarizing plate casually, the inventor found the occurrence of a phenomenon that a transparent or translucent part is formed therein, and the present invention has been completed as the result of study of this phenomenon. Theoretically, the shrinkage, dislocation, thermal modification, browning and formation of partial unevenness in thickness of the film of the polarizing plate and the shift of the optical axis of polarized light therein are caused by heating, the heated part appears as a pattern, and patterns and colors peculiar to the polarizing plate thus treated are formed when they are superposed.

In other words, the substance of the present invention is to draw a desired pattern by heating on a polarizing plate as described above. The polarizing plate includes a colored polarizing plate having a ground color such as gray, red, yellow, blue or the like. For heating, any means may be employed. Although a heat pen for exclusive use of which the temperature is adjustable is preferable, the means is not limited thereto. For instance, the pattern may be drawn on the polarizing plate by a metal rod or the like which is heated or warmed by the flame of a candle. The heating temperature is set, in principle, in a range wherein a polarizing film is melted or thermally modified, and it is also one of the techniques for forming the pattern that the heating time is varied with the temperature fixed. An interesting design is produced also by raising the heating temperature further to heat an acrylic polarizing plate so that the plate itself changes in the shape or the color. Furthermore, it is also one of the techniques making the design interesting that a physical change in the shape, such as a cut, is given in combination with the change by heating.

Desired patterns formed by heating include all modes, characters being included as well. Although any pattern imaged by a designer may be drawn on one polarizing plate, it is preferable that one prescribed pattern is divided and drawn on two or more polarizing plates and thereafter these polarizing plates are superposed. In the stage of superposition of the separate polarizing plates, positions of desired patterns and colors are selected. When one pattern is drawn on only one polarizing plate, other polarizing plates laid thereon are of no pattern. Besides, it is effective to lay a colored polarizing plate on two or more superposed polarizing plates, and tests are conducted with various colored polarizing plates substituted.

In this way, other polarizing plates are superposed on the polarizing plate whereon the pattern is drawn. "Other polarizing plates" mean polarizing plates superposed on the first polarizing plate whereon the pattern is drawn, and they include those whereon desired patterns are drawn also by heating and those whereon patterns are not drawn. In some cases, both of these plates are included. Accordingly, the number of the superposed polarizing plates to constitute a design carrier is two or more finally.

The hue of each pattern element is changed instantaneously and variously by changing the angle of superposition of the polarizing plates when they are superposed, or by replacing a colored polarizing plate with another. Therefore, a colored pattern which is matched with the image held by the designer is selected and the state thereof is fixed. In a part other than the part of the pattern, light is intercepted when the plates are superposed with the angles of polarization of light set perpendicular to each other. Therefore it is necessary to draw a pattern, taking the directions of polarization of the polarizing plates into consideration beforehand. While any means may be used for fixing the design selected, it is preferred to use an adhesive, a photograph negative film mount or the like.

In some cases, it is effective to superpose a desired material, as occasion calls, on the polarizing plates, besides the superposition of only polarizing plates. It is also one of the arts of the present invention, in other words, that a transparent material and/or an opaque material desired is superposed on a plurality of polarizing plates including one or more polarizing plates whereon desired patterns are drawn by heating, so as to constitute the design carrier. The transparent material includes all of partially-transparent or light-transmitting materials, including any of negative photographic film, color photographic film in particular, other synthetic resins, glass, cellophane, vinyl and mica or combinations thereof. The opaque material includes any of cloth, paper, synthetic resin and metal or combinations thereof, and it may be laid partly between the polarizing plates or stuck thereon.

It is desirable that the above-mentioned polarizing plates are held in the state of superposition by the photographic film mount when it is used.

DESCRIPTION OF REFERENCE MATERIALS

Designs appearing in the design carrier of the present invention have peculiarity in appearance of colors and it is impossible to describe them by drawings or monochromes. Therefore color photographs are attached hereto.

FIGS. 1-6 are color photographs produced according to the method of this invention and the differences will be explained in more detail hereinafter.

Figure 6:

Reference materials attached hereto are photographs prepared by putting one polarizing plate or superposed ones on a light table and photographing them. A photograph of FIG. 1 and a photograph of FIG. 2 are prepared by drawing patterns on one gray polarizing plate by heating, respectively, and a photograph of FIG. 3 is prepared by superposing the photographs of FIG. 1 and of FIG. 2 so that the optical axes thereof are perpendicular to each other so as to make the background black, while a photograph of FIG. 4 is prepared by superposing the polarizing plates of the photograph of FIG. 3 on a red polarizing plate. A photograph E shows a polarizing plate having a pattern like a hazy moon, which is formed by vignetting the edge of a circle, and a photograph of FIG. 6 is prepared by superposing a negative film having an image of flowers on said photograph of FIG. 5 and putting the material thus prepared between two polarizing plates, so as to constitute a design carrier.

OPERATION

Since the present invention is made as described above, when superposed polarizing plates are used as a slide film and set in a projector and an image formed therein is observed, the part of a pattern is observed as an area demarcated intentionally from others by heating. In the case where the layer of the polarizing film is melted completely, no phenomenon of polarization occurs and natural light passes therethrough. The part of the edge is often left in a state that the polarizing film turns thin, and distortion usually appears in the polarized light therein. When the melting is made gently-graduation intentionally by the way of heating, the area of a colored pattern is given a variation in intensity of the polarized light and thus gradation is produced. Besides, the part having the pattern drawn by a heating method is often modified by heat, shift in the direction of polarization occurs on the occasion, and in some cases, an angle of polarization turns different from the one different from that in other parts.

As described above, the light passing through the polarizing plates whereon patterns are drawn by heating is various according to the way of drawing of the patterns: natural light, polarized light, another polarized light different in the angle of polarization, and light varied gradually from polarized light to natural light. Moreover, ways of appearance of colors are different from one another according to the ways of heating. When the light thus obtained is turned into an image through another polarizing plate, accordingly, a state of being colored variously appears according to the mutual angle of the plates. According to this angle, the part passing the natural light exhibits the natural light as it is, while another part intercepts light completely and exhibits black, and further an intermediate part is colored with colors peculiar to the angles of polarization. A variety of colors thus obtained and these various colors develop a design.

The above-stated designs are formed by carriers comprising only of polarizing plates. When a design carrier is formed by interposing a negative photographic film between these plates, besides, an image in this film is combined with patterns on the polarizing plates and a design of a combination colored with fantastic colors can be obtained.

Embodiments

A description will be made hereunder in accordance with the photographs presented as reference materials. The photograph of FIG. 1 and the photograph of FIG. 2 are prepared respectively by a method wherein a desired pattern is drawn on one gray polarizing plate by heating and the plate is put on a light table and photographed. In these photographs, the gray part is of the ground color of the polarizing plate, while the part of a yellow pattern is of the polarizing plate which is melted to vanish by heating. As to the browned part, it is a part scorched by application of a rather high heat.

In the photograph of FIG. 2, a pattern having three laterally arranged circles and a plurality of oblique lines ascending left as fundamental pattern elements is drawn, and the parts of the oblique lines are formed by heating the polarizing plate until the plate itself is so melted as to be modified.

The photograph of FIG. 3 is prepared by photographing said two superposed polarizing plates, and a black part is formed by the intersection at right angles of the optical axes of the polarizing plates, while yellow parts are ones wherein a natural light not polarized appears as it is.

Figure 2:
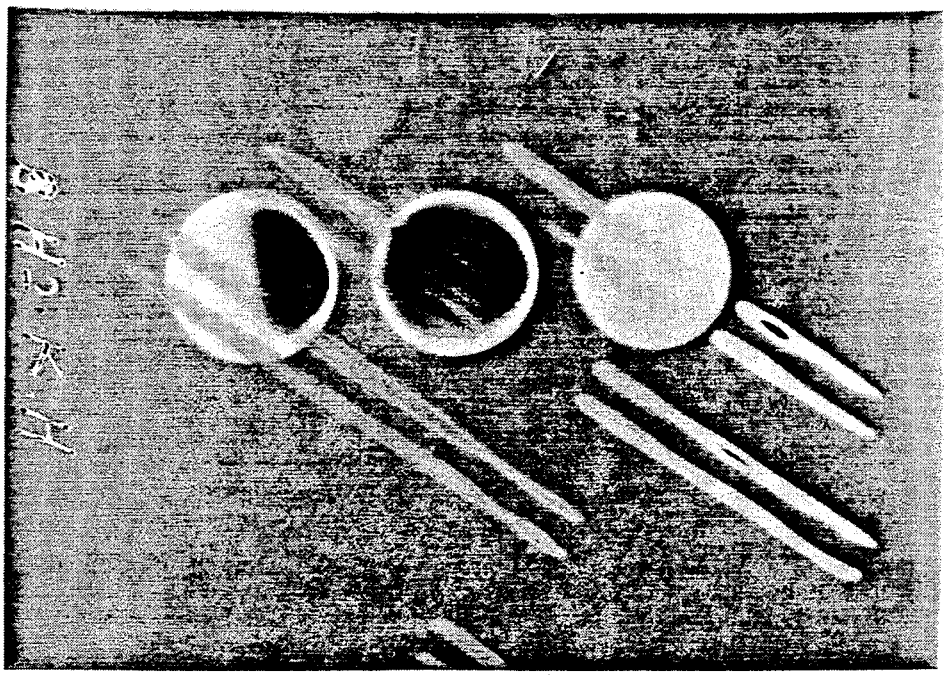
Figure 3:
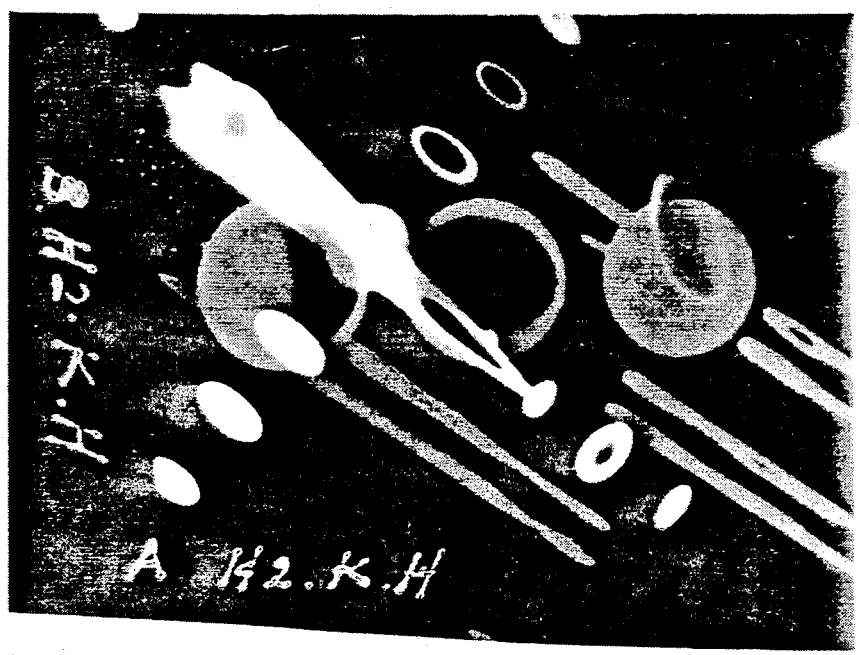
Figure 4:
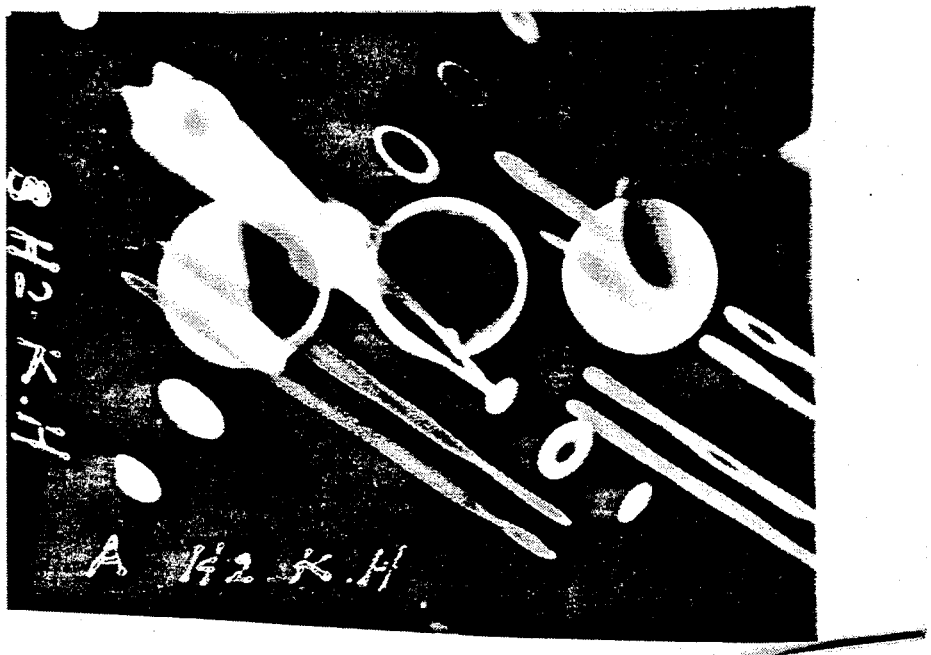
Figure 5:
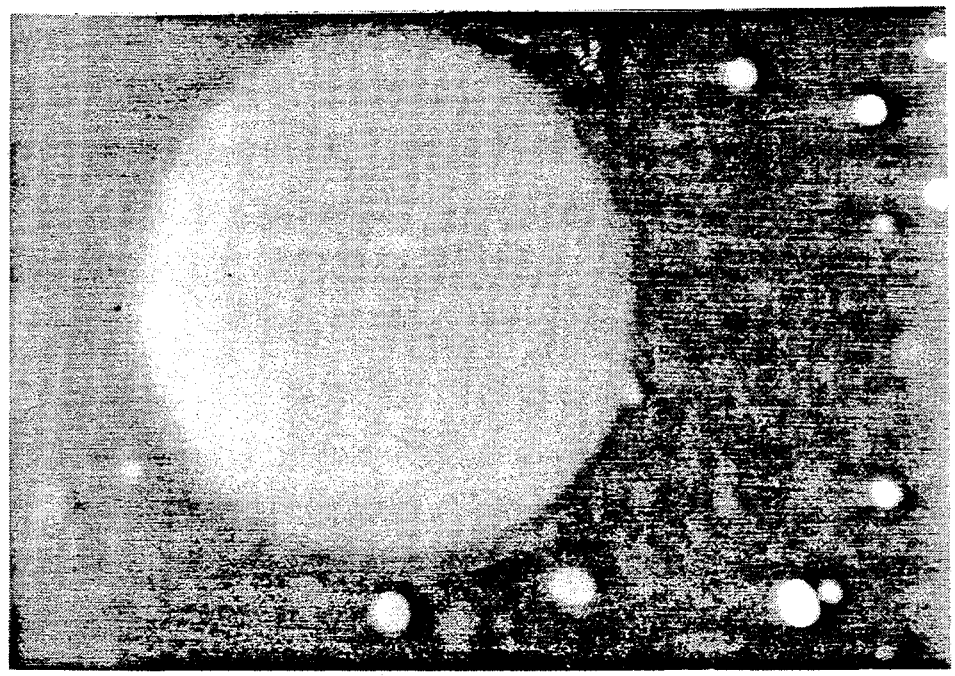

The photograph of FIG. 4 shows a design carrier produced when a red polarizing plate is laid in superposition under the polarizing plates of the photograph of FIG. 3 wherein the photographs of FIG. 1 and of FIG. 2 are superposed in this order from above. The part of the yellow pattern of the photographs of FIG. 1 appears as it is in the photograph of FIG. 4, while the yellow pattern in the polarizing plate of the photograph of FIG. 2 appears in red.

The photograph of FIG. 6 shows a design carrier prepared by a method wherein the negative photographic film having an image of flowers and the polarizing plate having a pattern like a moon formed by heating (the photograph of FIG. 5) are held between two polarizing plates including a polarizing plate colored in red.

EFFECT OF THE INVENTION

According to the present invention, as described above, a design carrier is prepared by drawing desired patterns on one or more polarizing plates by heating and by superposing them. The pattern drawn on each polarizing plate is left as a fundamental pattern when the plates are superposed, and constitutes a requisite pattern element in a final design, and colors which appear can be presupposed according to the way of drawing the pattern by heating. Unlike the conventional methods wherein the design is produced only accidentally, therefore, the present invention is very advantageous in that a designer can make designs of patterns and colors in accordance with his image or motif from the outset intentionally.

Besides, a light passing through the polarizing plate is changed variously by varying the way of heating and it is so polarized as to produce various colors. By varying a heat gradually, in addition, natural change of color, i.e. gradation thereof, can be expressed with ease. Therefore the degree of freedom of expression of patterns and colors is high and, moreover, colors coinciding with aimed colors can be made to appear instantaneously by using polarizing plates with colors in various combinations.

In addition, a pattern image formed by superposed polarizing plates is not formed of grains, unlike a photographic film carrier. Therefore margin of enlargement is very large and there is no possibility of occurrence of graininess.

Since the polarizing plate of the present invention is not a negative photographic film, moreover, it does not need to be developed and can be used as it is, as a film for a slide and an original copy for a print.

As described above, the present invention provides an epoch-making method quite different from prior-art methods for manufacturing design patterns wherein polarizing plates are employed.

What is claimed is:

1. A method of manufacturing a design carrier wherein a desired pattern is drawn on a polarizing plate by heating and another polarizing plate is superposed thereon to make one design carrier.

2. A method of manufacturing a design carrier according to claim 1, wherein the pattern is drawn with the heating temperature varied.

3. A method of manufacturing a design carrier according to claim 1, wherein the pattern is drawn with a heat applied to said polarizing plate in such a degree as to change the shape of the plate.

4. A method of manufacturing a design carrier according to claim 1, wherein the desired pattern is drawn also on other polarizing plate by heating.

5. A method of a manufacturing a design carrier according to claim 1, wherein no desired pattern is drawn on said other polarizing plate.

6. A method of manufacturing a design carrier according to claim 1, wherein said other polarizing plates include the one whereon the pattern is drawn by heating and the one whereon no pattern is drawn.

7. A method of manufacturing a design carrier according to claim 1, wherein all of said polarizing plates or some of them are colored polarizing plates.

8. A method of manufacturing a design carrier wherein a desired transparent and/or a opaque material desired is superposed on a plurality of polarizing plates including one or more polarizing plates having desired patterns drawn by heating, so as to make the design carrier.

9. A method of manufacturing a design carrier according to claim 8, wherein said transparent material is any one of a negative photographic film, synthetic resin, glass, cellophane, vinyl and mica or a combination thereof.

10. A method of a design carrier according to claim 8, wherein said opaque material is any one of cloth, paper, synthetic resin and metal or a combination thereof.

11. A design carrier which is composed of a plurality of superposed polarizing plates including a polarizing plate whereon a desired pattern is drawn by heating.

* * * * *